(12) United States Patent
Chang et al.

(10) Patent No.: US 10,262,731 B2
(45) Date of Patent: *Apr. 16, 2019

(54) DEVICE AND METHOD FOR FORMING RESISTIVE RANDOM ACCESS MEMORY CELL

(71) Applicant: Taiwan Semiconductor Manufacturing Company Limited, Hsinchu (TW)

(72) Inventors: Chih-Yang Chang, Changhua County (TW); Wen-Ting Chu, Kaohsiung (TW); Yu-Wei Ting, Taipei (TW); Chun-Yang Tsai, New Taipei (TW); Kuo-Ching Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/067,268

(22) Filed: Mar. 11, 2016

(65) Prior Publication Data

US 2016/0196875 A1 Jul. 7, 2016

Related U.S. Application Data

(63) Continuation of application No. 14/034,717, filed on Sep. 24, 2013, now Pat. No. 9,286,973.

(51) Int. Cl.
*G11C 13/00* (2006.01)

(52) U.S. Cl.
CPC ...... *G11C 13/0021* (2013.01); *G11C 13/0002* (2013.01); *G11C 13/0038* (2013.01); *G11C 13/0069* (2013.01); *G11C 2013/0071* (2013.01); *G11C 2013/0083* (2013.01); *G11C 2213/79* (2013.01)

(58) Field of Classification Search
CPC ........ G11C 2013/0083; G11C 13/0002; G11C 13/0069; G11C 2213/79; G11C 13/0021; G11C 13/0038; G11C 2013/0071
USPC ........................................................ 365/148
See application file for complete search history.

(56) References Cited

U.S. PATENT DOCUMENTS

| | | | | |
|---|---|---|---|---|
| 6,285,585 B1* | 9/2001 | Kurihara | ............. | G11C 7/1051 |
| | | | | 365/185.08 |
| 6,714,454 B2* | 3/2004 | Ma | ..................... | G11C 16/0458 |
| | | | | 257/E29.308 |
| 8,553,444 B2* | 10/2013 | Muraoka | ............ | G11C 13/0007 |
| | | | | 365/148 |
| 8,848,421 B2 | 9/2014 | Kawai et al. | | |
| 8,982,602 B2* | 3/2015 | Sunkavalli | ........... | G11C 7/1045 |
| | | | | 365/148 |
| 9,007,810 B2* | 4/2015 | Siau | ........................ | G11C 7/20 |
| | | | | 365/148 |
| 9,236,122 B2* | 1/2016 | Yan | ..................... | G11C 13/0023 |
| 2004/0156244 A1* | 8/2004 | Becker | ...................... | G11C 8/08 |
| | | | | 365/189.11 |
| 2010/0097841 A1 | 4/2010 | Lu et al. | | |

(Continued)

*Primary Examiner* — Xiaochun L Chen

(74) *Attorney, Agent, or Firm* — Jones Day

(57) ABSTRACT

A device includes a first word line, a resistive random access memory (RRAM) cell, a second word line, and a charge pump circuit. The RRAM cell is coupled to the first word line and is not formed. The charge pump circuit is coupled to the second word line and is configured to provide a negative voltage. Methods of forming the device are also disclosed.

20 Claims, 8 Drawing Sheets

(56) References Cited

U.S. PATENT DOCUMENTS

| | | | |
|---|---|---|---|
| 2011/0044088 A1* | 2/2011 | Muraoka | G11C 13/0007 365/148 |
| 2011/0085370 A1* | 4/2011 | Chen | G11C 13/0007 365/148 |
| 2013/0044534 A1 | 2/2013 | Kawai et al. | |
| 2013/0148408 A1* | 6/2013 | Kawai | G11C 13/0007 365/148 |
| 2014/0036573 A1* | 2/2014 | Ishihara | G11C 13/0021 365/148 |
| 2014/0063901 A1* | 3/2014 | Sunkavalli | G11C 7/1045 365/148 |
| 2014/0241035 A1* | 8/2014 | Siau | G11C 7/20 365/148 |
| 2014/0254256 A1 | 9/2014 | Choi | |
| 2014/0301128 A1 | 10/2014 | Park | |
| 2015/0036414 A1* | 2/2015 | Yan | G11C 13/003 365/148 |

* cited by examiner

| Stress Voltage / Stress Time | | Initial | 0.3" | | 1" | | 3" | | 10" | |
|---|---|---|---|---|---|---|---|---|---|---|
| Case A1 | Ir1 (uA) | 57.2 | 56.6 | -1.1% | 56.0 | -2.2% | 54.8 | -4.3% | 52.5 | -8.2% |
| | Isof (A) | 3.15E-11 | 4.54E-11 | 1.4 | 1.00E-10 | 3.2 | 3.40E-10 | 10.8 | 2.09E-10 | 6.6 |
| Case A2 | Ir1 (uA) | 57.2 | 54.9 | -4.0% | 51.6 | -9.9% | 49.0 | -14.4% | 43.5 | -23.9% |
| | Isof (A) | 3.04E-11 | 9.36E-11 | 3.1 | 6.11E-10 | 20.1 | 3.68E-10 | 12.1 | 5.76E-10 | 18.9 |
| Case A3 | Ir1 (uA) | 56.2 | 47.2 | -16.1% | 38.2 | -32.1% | 34.0 | -39.6% | 29.1 | -48.2% |
| | Isof (A) | 1.06E-10 | 1.88E-09 | 17.8 | 3.17E-09 | 30.0 | 2.47E-09 | 23.4 | 4.12E-09 | 39.1 |

Fig.2A

| Stress Voltage / Stress Time | | Initial | 0.3" | | 1" | | 3" | | 10" | |
|---|---|---|---|---|---|---|---|---|---|---|
| Case B1 | Ir1 (uA) | 55.0 | 54.9 | -0.1% | 54.8 | -0.4% | 54.6 | -0.6% | 54.0 | -1.7% |
| | Isof (A) | 3.44E-11 | 3.59E-11 | 1.0 | 4.07E-11 | 1.2 | 4.51E-11 | 1.3 | 5.26E-11 | 1.5 |
| Case B2 | Ir1 (uA) | 56.4 | 56.1 | -0.6% | 55.7 | -1.3% | 55.1 | -2.3% | 53.9 | -4.5% |
| | Isof (A) | 5.17E-11 | 6.02E-11 | 1.2 | 6.98E-11 | 1.3 | 1.34E-10 | 2.6 | 1.70E-10 | 3.3 |
| Case B3 | Ir1 (uA) | 58.1 | 56.7 | -2.3% | 54.8 | -5.7% | 51.9 | -10.7% | 46.0 | -20.8% |
| | Isof (A) | 3.29E-11 | 6.47E-11 | 2.0 | 1.24E-10 | 3.8 | 2.68E-10 | 8.1 | 8.66E-10 | 26.3 |

Fig.2B

DEVICE AND METHOD FOR FORMING RESISTIVE RANDOM ACCESS MEMORY CELL

CROSS-REFERENCE TO RELATED APPLICATION

This application is a continuation of U.S. patent application Ser. No. 14/034,717, filed Sep. 24, 2013, which is incorporated by reference herein in its entirety.

FIELD

The technology described in this patent document generally relates to memory, and, more particularly, to a resistive random access memory and a method of forming a resistive random access memory cell.

BACKGROUND

Resistive random access memory (RRAM) is one of the possible candidates for next generation nonvolatile memory technology due to its simple and CMOS logic compatible process. The RRAM cell is a metal oxide material sandwiched between top and bottom electrodes. By applying voltage to the RRAM cell, a switching event from high resistance state (HRS) to low resistance state (LRS) occurs and is called the "set" process. Conversely, the switching event from LRS to HRS is called the "reset" process. The low and high resistance are utilized to indicate a digital signal, "1" or "0", thereby allowing for data storage. Before the RRAM cell is capable of switching from/to HRS/LRS, a forming process generally takes place.

BRIEF DESCRIPTION OF THE DRAWINGS

FIGS. 2A and 2B are tables generated by a circuit simulation showing read current and the turn-off current of the second transistor 122 influenced by the charge pump circuit 102 or the voltage on the second word line 162 after the forming process.

DETAILED DESCRIPTION

Reference will now be made in detail to exemplary embodiments consistent with the present invention, which are illustrated in the accompanying drawings. Wherever possible, the same reference numbers will be used throughout the drawings to refer to the same or like parts.

Figure 1:
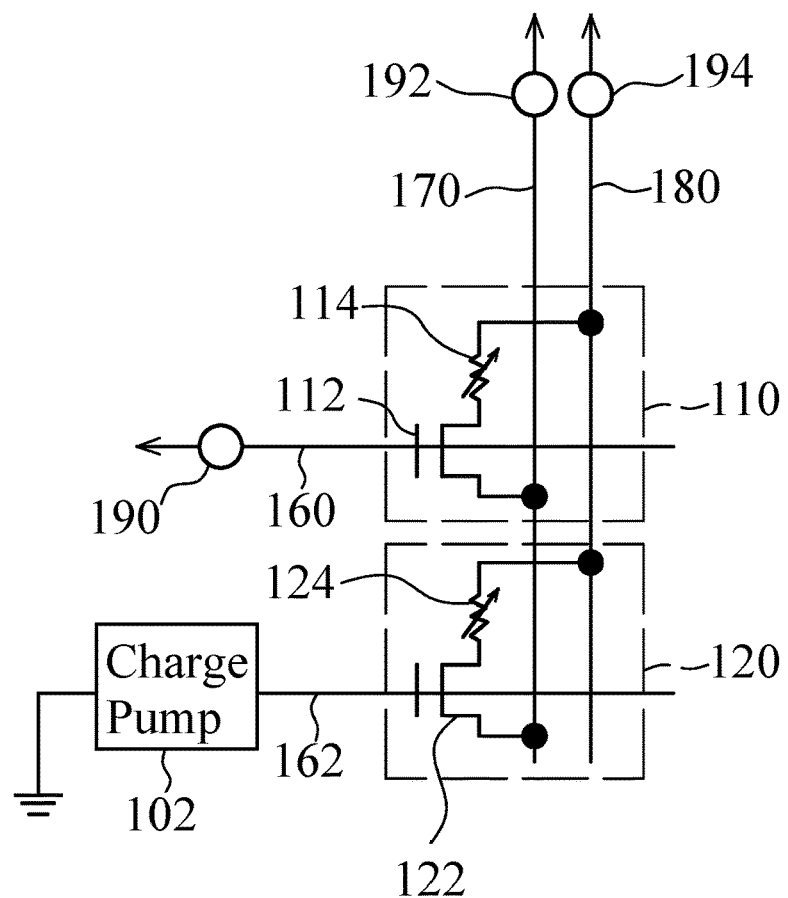
FIG. 1 is an exemplary diagram for an RRAM according to various embodiments.

FIG. 1 is an exemplary diagram for a resistive random access memory. As shown in FIG. 1, an RRAM (resistive random access memory) 100 is provided. In some embodiments, the RRAM 100 includes a first RRAM cell 110, a second RRAM cell 120, a first voltage source 190, a second voltage source 192, a third voltage source 194 and a charge pump circuit 102. The first RRAM cell 110 includes a first transistor 112 and a first variable resistor 114. The second RRAM cell 120 includes a second transistor 122 and a second variable resistor 124.

In some embodiments, a variable resistor may be formed by a three layer structure including a top electrode layer, a bottom electrode layer and a variable resistance material layer. In general, after the variable resistor is initially fabricated, the variable resistance material layer does not exhibit switching properties. Then, the forming process described herein is performed to form one or more localized conductive filament(s) with oxygen vacancies. Whenever a filament is referred to within this document, it should be appreciated that one or more filaments within the variable resistance material layer. In some embodiments, the top electrode layer is formed of, for example, tantalum nitride and titanium. The bottom electrode layer may be formed of, for example, titanium nitride. The variable resistance material layer may be formed of, for example, hafnium dioxide.

The gate of the first transistor 112 of the first RRAM cell 110 may be connected to a first word line 160. The drain of the first transistor 112 of the first RRAM cell 110 is connected to one terminal of the first variable resistor 114. The source of the first transistor 112 of the first RRAM cell 110 may be connected to a first source line 170. The other terminal of the first variable resistor 114 may be connected to a first bit line 180.

The gate of the second transistor 122 of the second RRAM cell 120 may be connected to a second word line 162. The drain of the second transistor 122 of the second RRAM cell 120 is connected to one terminal of the second variable resistor 124. The source of the second transistor 122 of the second RRAM cell 120 may be connected to the first source line 170. The other terminal of the second variable resistor 124 may be connected to the first bit line 180.

The first voltage source 190 may be connected to the first word line 160. The second voltage source 192 may be connected to the first source line 170. The third voltage source 194 may be connected to the first bit line 180. The first voltage source 190 may provide a first voltage to the first word line 160 to form first variable resistor 114 of the first RRAM cell 110. The second voltage source 192 may provide a second voltage to the first source line 170. The third voltage source 194 may provide a third voltage to the first bit line 180. The charge pump circuit 102 may be connectively attached to and provide a negative voltage to the second word line 162.

The first voltage may be, for example, 0.5 to 2 Volts and turn on the first transistor 112 of the first RRAM cell 110. The negative voltage supplied by the charge pump circuit 102 may be, for example, −0.2 to −0.5 Volts to turn off the second transistor 122 of the second RRAM cell 120. The second voltage may be ground. The third voltage may be, for example, 2.5 to 3.5 Volts during a forming process. After the forming process, the third voltage for normal operation may be provided to the first bit line 180 and may be, for example, 1.2 to 2 Volts.

In some embodiments, the negative voltage provided by the charge pump circuit 102 to the second word line 162 acts to substantially suppress subthreshold leakage current that flows through the second transistor 122 and the second variable resistor 124 of the second RRAM cell 120 during the forming process, so as to reduce the damage on the second transistor 122 caused by the subthreshold leakage current.

In some embodiments, a resistance of a variable resistor may depend on the status of formation. When the second variable resistor 124 of the second RRAM cell 120 has not been formed, it may be about several million Ohms; when the second variable resistor 124 of the second RRAM cell 120 is formed, it may be in a low resistance state which is lower than, for example, 5000 Ohms. Therefore, the subthreshold leakage current that flows through a second transistor 122 when the second variable resistor 124 is in a low resistance state may damage the second transistor more than what would occur when the second variable resistor 124 has not been formed.

In some embodiments, the negative voltage may be provided during a formation process to RRAM cells that are not being formed, that have already been formed, or any combination of the two. The RRAM cells that are not being formed will be referred to herein as "unselected RRAM cells".

FIGS. 2A and 2B are tables generated by a circuit simulation showing read current and the turn-off current of the second transistor 122 influenced by the charge pump circuit 102 or the voltage on the second word line 162 after the forming process. As shown in FIGS. 1, 2A, and 2B, the term "stress time" refers to the duration of the forming process that forms the first variable resistor 114, and the term "stress voltage" refers to the voltage applied on the first bit line 180 during the forming process. The term "Initial" refers to the state before the forming process.

Referring to FIGS. 1 and 2A, the voltage on the first source line 170 may be 0 Volts, the voltage on the first word line 160 may be 1.4 Volts, and the second word line 162 may be shorted to ground and without connection to the charge pump circuit 102. For example, in Case A1 with a "stress voltage" being 3.0 Volts, initially (before the forming process), the read current Ir1 of the second transistor 122 may be 57.2 micro Ampere and the turn-off current Isof of the second transistor 122 may be 3.15E-11 Ampere. Given that "stress time" is 0.3 seconds, after the forming process the read current Ir1 of the second transistor 122 may be 56.6 micro Ampere, and the turn-off current Isof of the second transistor 122 may be 4.54E-11 Ampere. That is, the forming process in Case A1 may degrade the read current Ir1 by 1.1% and the turn-off current Isof by 1.4%. In Case A2, "stress voltage" may be 3.2 Volts. In Case A3, "stress voltage" may be 3.4 Volts. The other circumstances shown in FIG. 2A may be read accordingly.

Referring to FIGS. 1 and 2B, the voltage on the first source line 170 may be 0 Volts, the voltage on the first word line 160 may be 1.4 Volts, and the voltage that the charge pump circuit 102 provides to the second word line 162 may be −0.3 Volts. For example, in Case B1 with a "stress voltage" being 3.0 Volts, initially (before the forming process), the read current Ir1 of the second transistor 122 may be 55.0 micro Ampere, and the turn-off current Isof of the second transistor 122 may be 3.44E-11 Ampere. Given that "stress time" is 0.3 seconds, after the forming process, the read current Ir1 of the second transistor 122 may be 54.9 micro Ampere, and the turn-off current Isof of the second transistor 122 may be 3.59E-11 Ampere. That is, the forming process in Case B1 may merely degrade the read current Ir1 by 0.1% and the turn-off current Isof by 1.0%. In Case B2, "stress voltage" may be 3.2 Volts. In Case B3, "stress voltage" may be 3.4 Volts. The other circumstances shown in FIG. 2B may be read accordingly.

By comparing FIGS. 2A and 2B, it is shown that the degradation of read current Ir1 and the turn-off current Isof of the second transistor 122 in the cases B1, B2, and B3 may be better than those in the cases A1, A2, and A3, respectively. Therefore, using the charge pump circuit 102 to provide the negative voltage on the second word line 162 reduces the degradation of the second transistor 122. In other words, the negative voltage provided to the unselected RRAM cell that is not being formed or that has been formed may help reduce degradation of the transistor of the unselected RRAM cell.

Figure 3A:
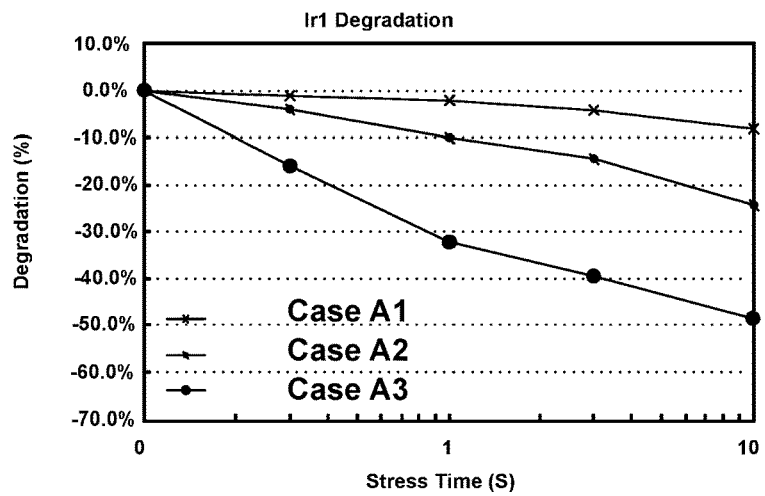
FIGS. 3A and 3B are plots showing the read current and the turn-off current of the second transistor influenced by the charge pump circuit or the voltage on the second word line after the forming process.
Figure 3B:
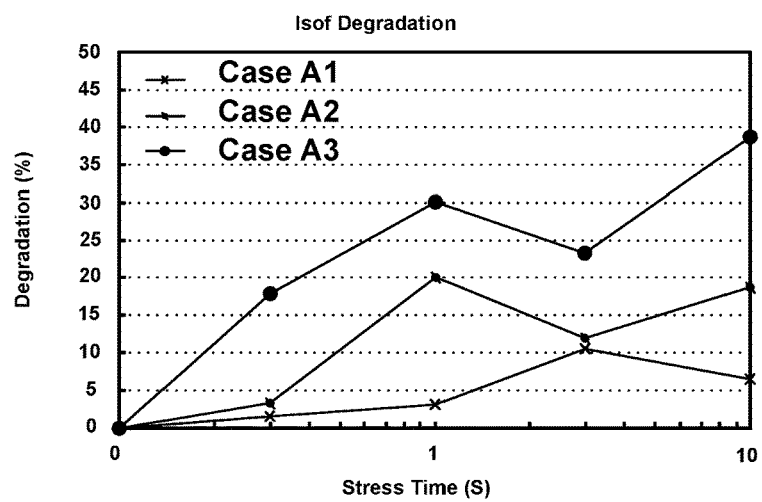
Figure 3C:
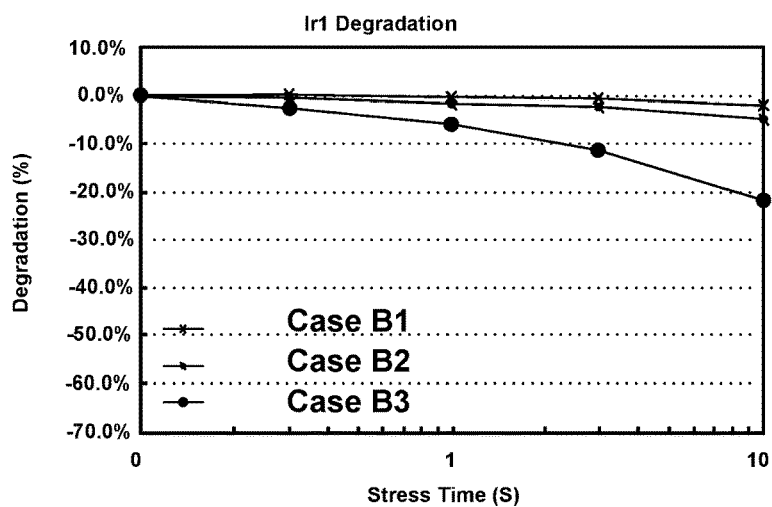
FIGS. 3C and 3D are plots that correspond to FIG. 2B.
Figure 3D:
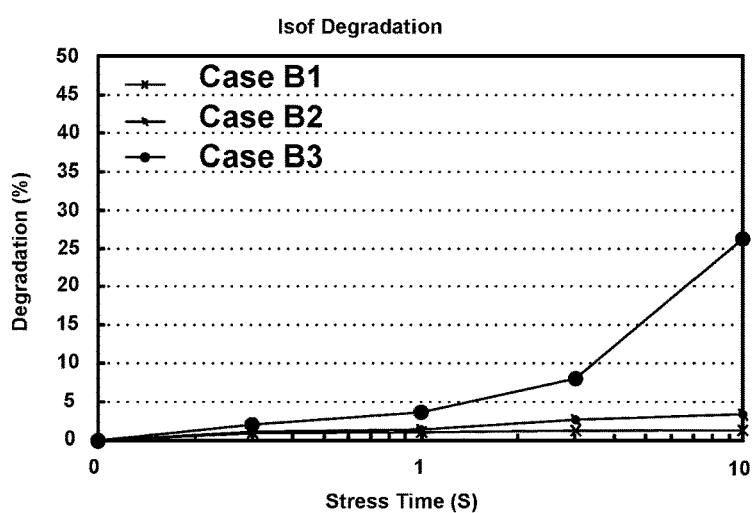

FIGS. 3A and 3B are exemplary plots showing the read current and the turn-off current of the second transistor 122 influenced by the charge pump circuit 102 or the voltage on the second word line 162 after the forming process. FIGS. 3A and 3B correspond to FIG. 2A, and FIGS. 3C and 3D correspond to FIG. 2B. With those plots in FIGS. 3A to 3D, it may be observed that the negative voltage provided to the unselected RRAM cell that is not being formed or that has been formed may help on degradation of the transistor of the unselected RRAM cell.

Figure 4:
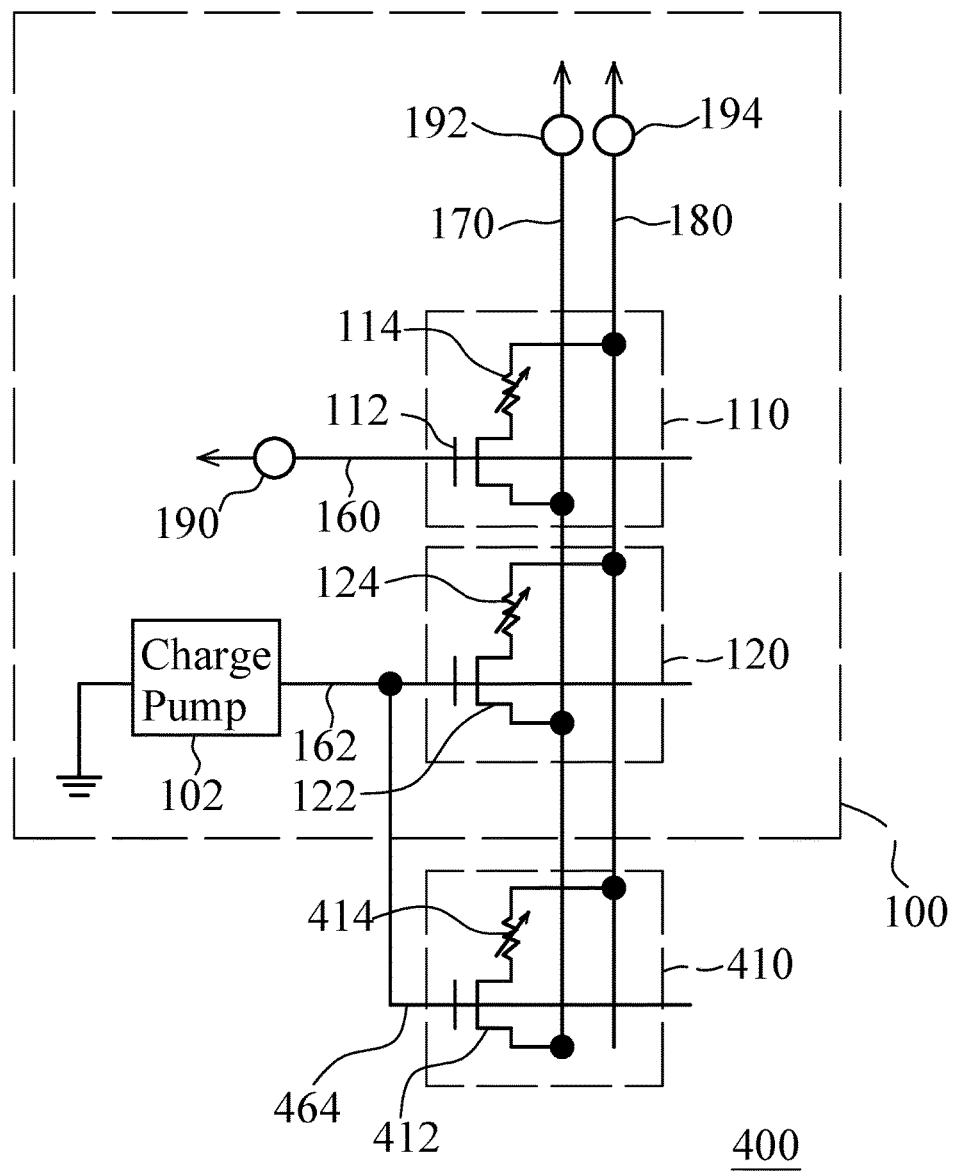
FIG. 4 is an exemplary diagram for an RRAM according to various embodiments.

FIG. 4 is an exemplary diagram of an RRAM according to various embodiments. As shown in FIG. 4, a second RRAM 400 may be provided. The second RRAM 400 includes a third RRAM cell 410 in addition to the RRAM 100. The third RRAM cell 410 includes a third transistor 412 and a third variable resistor 414.

The gate of the third transistor 412 of the third RRAM cell 410 may be connected to a third word line 464. The drain of the third transistor 412 of the third RRAM cell 410 is connected to one terminal of the third variable resistor 414. The source of the third transistor 412 of the third RRAM cell 410 may be connected to the first source line 170. The other terminal of the third variable resistor 414 may be connected to the first bit line 180. The charge pump circuit 102 may be connectively attached to and provide a negative voltage to the third word line 464. The negative voltage supplied by the charge pump circuit 102 may be, for example, −0.2 to −0.5 Volts to turn off the third transistor 412 of the third RRAM cell 410.

In addition to the reduction of the damage on the second transistor 122, the negative voltage provided by the charge pump circuit 102 to the third word line 464 may further suppress the subthreshold leakage current that flows through a third transistor 412 and a third variable resistor 414 of the third RRAM cell 410 during the forming process, so as to reduce the damage on the third transistor 412 by the subthreshold leakage current.

Figure 5:
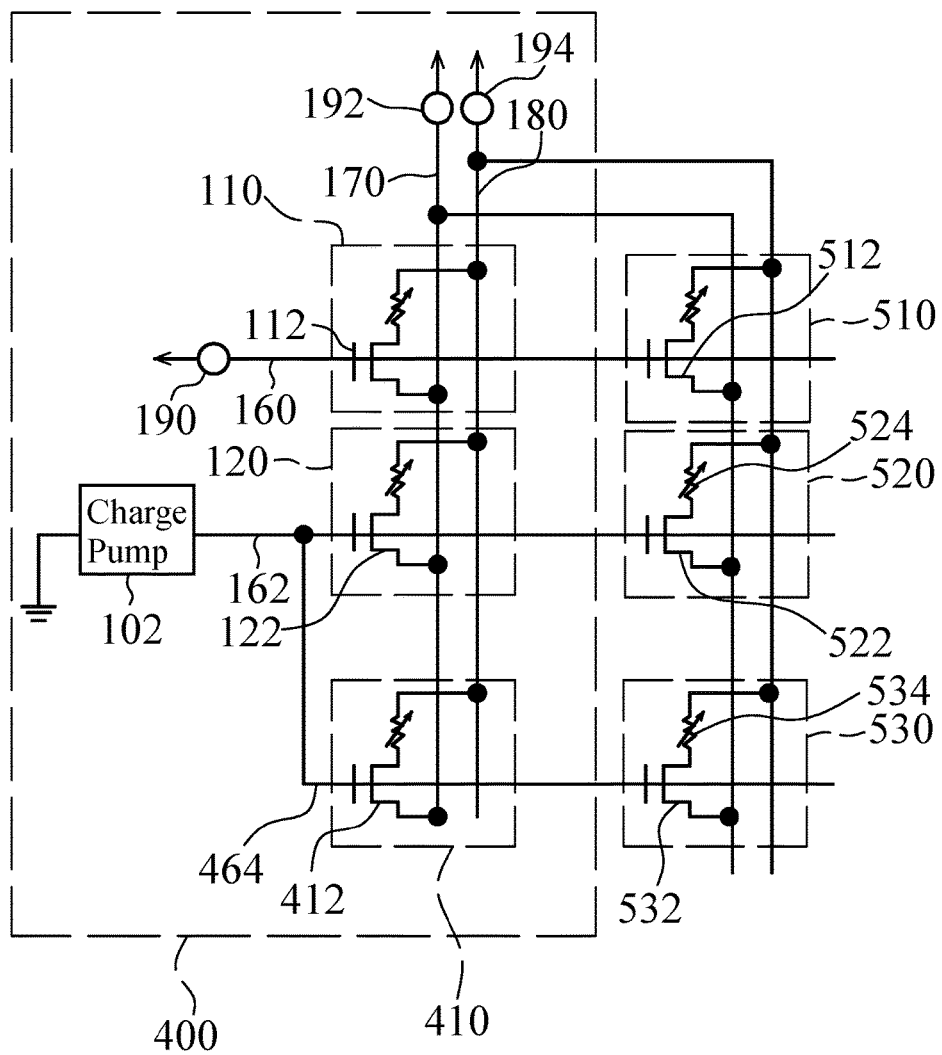
FIG. 5 is an exemplary diagram for an RRAM according to various embodiments.

FIG. 5 is an exemplary diagram for an RRAM according to various embodiments. As shown in FIG. 5, a third RRAM 500 is provided. The third RRAM 500 includes a fourth RRAM cell 510, a fifth RRAM cell 520, and a sixth RRAM cell 530 in addition to the second RRAM 400. The RRAM cells 510, 520, 530 are configured similar to the RRAM cells 110, 120, 410 and may not be repeated herein. The fourth RRAM cell 510 may be connected to the first word line 160. The first voltage source 170 may provide the first voltage to form the fourth RRAM cell 510. The fifth RRAM cell 520 may be connected to the second word line 162. The charge pump circuit 102 may provide the negative voltage to the second word line 162. The sixth RRAM cell 530 may be connected to the third word line 464. The charge pump circuit 102 may also provide the negative voltage to the third word line 464.

In addition to the reduction of the damage on the second transistor 122 and the third transistor 412, the negative voltage provided by the charge pump circuit 102 to the second word line 162 and the third word line 464 may suppress the subthreshold leakage current that flows through a fifth transistor 522 and a fifth variable resistor 524 of the fifth RRAM cell 520 and a sixth transistor 532 and a sixth variable resistor 534 of the sixth RRAM cell 530 during the forming process so as to reduce the damage on the fifth transistor 522 and the sixth transistor 532 by the subthreshold leakage current.

Figure 6:
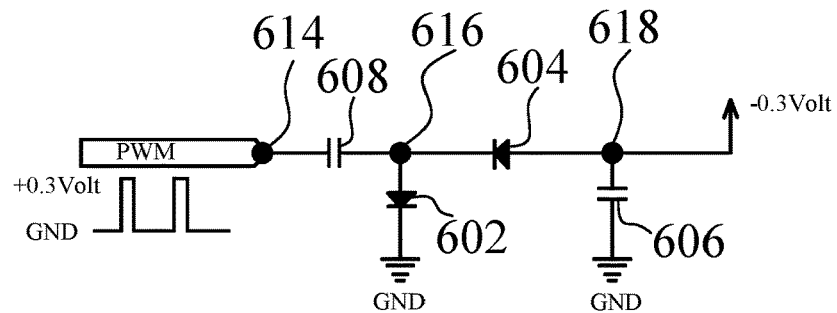
FIG. 6 is a diagram of an exemplary charge pump circuit that may be implemented in various embodiments.

FIG. 6 is a diagram of an exemplary charge pump circuit that may be implemented in some embodiments. The exemplary charge pump circuit 102 includes capacitors 606, 608, diodes 602, 604. The terminal 614 of the capacitor 608 may receive a PWM signal which may be, for example, 0.3 Volts. The diode 602 may be connected between the terminal 616 of the capacitor 608 and ground. The diode 604 may be connected between the terminal 616 of the capacitor 608 and the terminal 618 of the diode 606. The other terminal of the diode 606 may be connected to ground. The charge pump circuit 102 may receive the PWM signal by the terminal 614 to generate, at the terminal 618, the negative voltage which may be, for example, −0.3 Volts. The charge pump circuit 102 may embed an oscillator to provide the PWM signal without receiving an external one. The charge pump circuit 102 in FIG. 6 may be applied to the RRAMs 100, 400, 500 in FIGS. 1, 4 and 5 respectively. Those skilled in the art upon reading this disclosure will appreciate that other charge pump circuits could be used.

Figure 7:
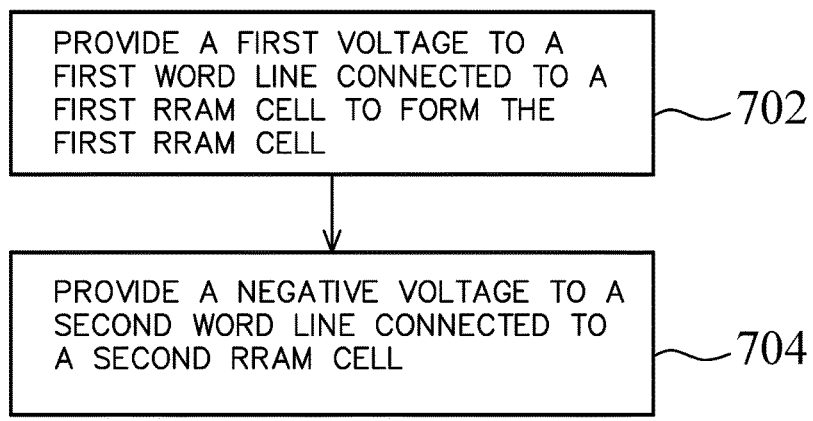
FIG. 7 is a first exemplary flow chart for forming an RRAM cell.

FIG. 7 is a first exemplary flow chart for forming an RRAM cell. The method 700 may include the following procedures: providing a first voltage to a first word line connected to a first RRAM cell to form the first RRAM cell (702); and providing a negative voltage to a second word line connected to a second RRAM cell (704).

Figure 8:
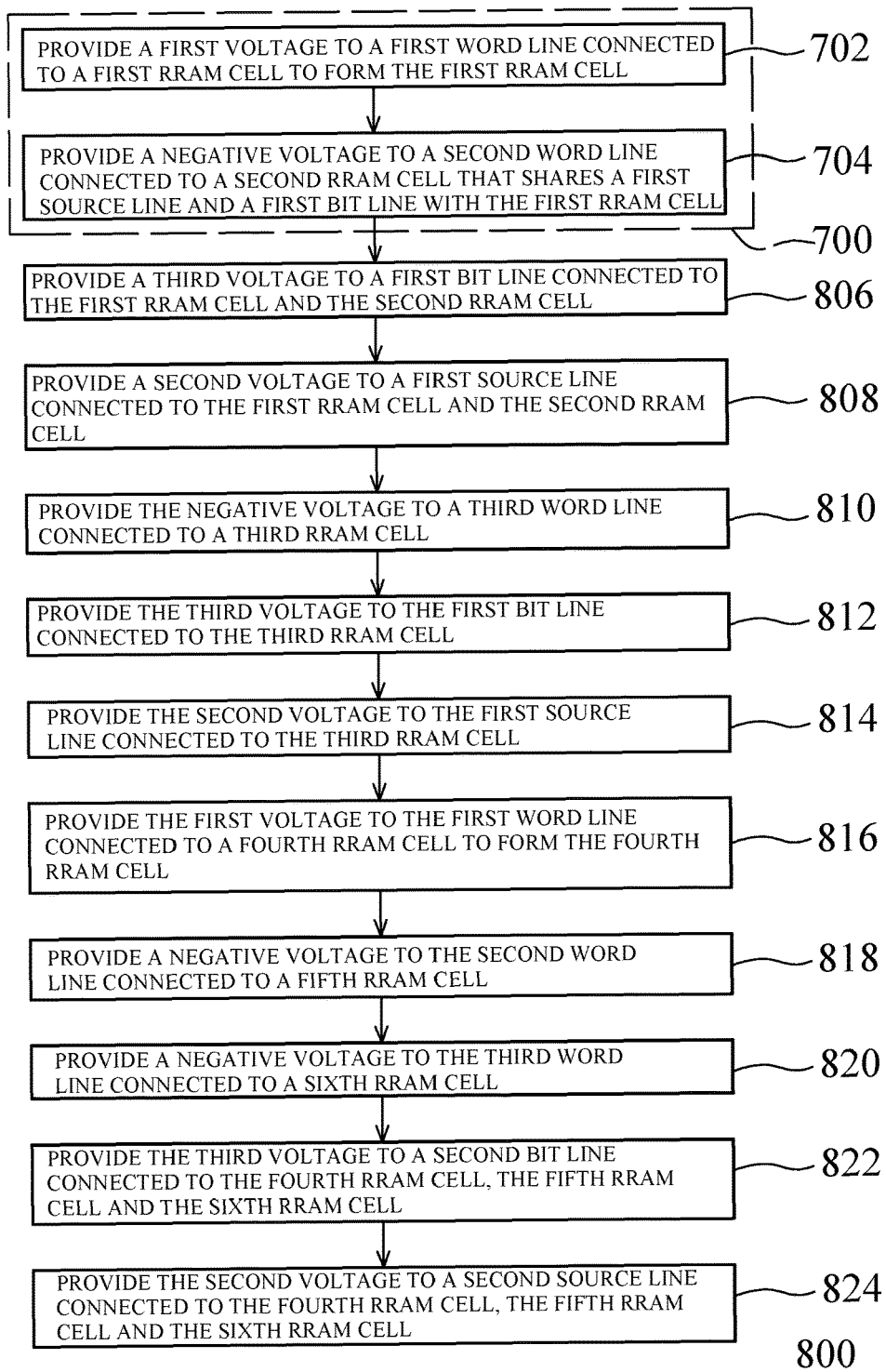
FIG. 8 is a second exemplary flow chart for forming an RRAM cell.

FIG. 8 is a second exemplary flow chart for forming an RRAM cell. The method 800 may include the following procedures: providing a first voltage to a first word line connected to a first RRAM cell to form the first RRAM cell (702); providing a negative voltage to a second word line connected to a second RRAM cell that shares a first source line and a first bit line with the first RRAM cell(704); providing a third voltage to a first bit line connected to the first RRAM cell and the second RRAM cell (806); providing a second voltage to a first source line connected to the first RRAM cell and the second RRAM cell (808); providing the negative voltage to a third word line connected to a third RRAM cell (810); providing the third voltage to the first bit line connected to the third RRAM cell (812); providing the second voltage to the first source line connected to the third RRAM cell (814); providing the first voltage to the first word line connected to a fourth RRAM cell to form the fourth RRAM cell (816); providing a negative voltage to the second word line connected to a fifth RRAM cell (818); providing a negative voltage to the third word line connected to a sixth RRAM cell (820); providing the third voltage to a second bit line connected to the fourth RRAM cell, the fifth RRAM cell and the sixth RRAM cell (822); and providing the second voltage to a second source line connected to the fourth RRAM cell, the fifth RRAM cell and the sixth RRAM cell (824).

In some embodiments, the first RRAM cell may be to be formed, and the second RRAM cell may be formed, wherein the negative voltage may reduce a current that flows through a second transistor and a second variable resistor of the second RRAM cell when forming a first variable resistor in the first RRAM cell.

An exemplary device comprises a first word line, a resistive random access memory (RRAM) cell coupled to the first word line and not formed, a second word line, and a charge pump circuit coupled to the second word line and configured to provide a negative voltage.

An exemplary method of forming a device comprises providing a resistive random access memory (RRAM) cell that is coupled to a first word line and that is not formed, providing a charge pump circuit that is configured to provide a negative voltage, and coupling a second word line to the charge pump circuit.

Another exemplary method of forming a device comprises forming a resistive random access memory (RRAM) cell coupled to a first word line and applying a negative voltage to a second word line.

This written description uses examples to disclose the disclosure, include the best mode, and also to enable a person skilled in the art to make and use the disclosure. The patentable scope of the disclosure may include other examples that occur to those skilled in the art.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A resistive random access memory (RRAM) array comprising:
    a first word line of the RRAM array;
    a first voltage source line for providing a first source voltage;
    a variable voltage source coupled to a bitline for selectably providing memory operation voltages or a forming voltage, the forming voltage having a magnitude greater than the memory operation voltages, the difference between the forming voltage and the first source voltage capable of forming a variable resistor;
    a first resistive random access memory (RRAM) cell including a first variable resistor coupled in series with the first voltage source line and the bitline and a first drain of a first transistor, the first word line coupled to a first gate of the first transistor; and
    a second word line of the RRAM array;
    a second RRAM cell including a second transistor having a second gate coupled to the second word line, the second transistor having a second drain coupled in series with a second variable resistor, the first voltage source line, and the bitline; and
    a charge pump circuit coupled to the second word line and configured to provide a negative voltage to the second gate when the variable voltage source is selectably providing the forming voltage to the bitline thereby suppressing subthreshold leakage current through the second variable resistor during formation of the first variable resistor.

2. The resistive random access memory (RRAM) array of claim 1, wherein forming a variable resistor causes one or more local conductive filaments to form within a variable resistance material within the variable resistor, further wherein the first variable resistor has first resistance of several million ohms prior to forming and the second resistor is formed and has a second resistance is less than 5000 ohms, the first variable resistor having a third resistance after forming of less than 5000 ohms.

3. The resistive random access memory (RRAM) array of claim 2, further comprising:
    a plurality of RRAM cells;
    a plurality of bit lines respectively coupled to the RRAM cells; and
    a plurality of second RRAM cells coupled to the second word line and respectively coupled to the bit lines.

4. The resistive random access memory (RRAM) array of claim 1, further comprising:
    a plurality of RRAM cells; and
    a plurality of source lines respectively coupled to the RRAM cells.

5. The resistive random access memory (RRAM) array of claim 4, further comprising a plurality of second RRAM cells coupled to the second word line and respectively coupled to the source lines.

6. The resistive random access memory (RRAM) array of claim 1, wherein the variable resistance material comprises hafnium.

7. The resistive random access memory (RRAM) array of claim 1, wherein the second variable resistor comprises one or more localized conductive filaments formed within the variable resistance material.

8. The resistive random access memory (RRAM) array of claim 1, further comprising a third word line coupled to the charge pump circuit.

9. A method of forming a resistive random access memory (RRAM) array, comprising:
    providing a voltage source coupled to a bitline;
    providing a first resistive random access memory (RRAM) cell coupled to the bitline, the first RRAM cell being unformed and having a first transistor gate that is coupled to a first word line of the RRAM array;
    providing a second RRAM cell coupled to the bitline and having a second gate that is coupled to a second word line of the RRAM array;
    coupling a charge pump circuit to the second word line; and
    configuring the voltage source and the charge pump to operate cooperatively to form the first RRAM cell by:
    configuring the charge pump circuit to provide a negative voltage to the second word line; and
    configuring the voltage source to provide a forming voltage to the bitline thereby forming the first RRAM cell, wherein the negative voltage provided to the second wordline suppresses subthreshold leakage current through the second RRAM cell during formation of the first RRAM cell.

10. The method of claim 9, further comprising configuring bit lines respectively coupled to a plurality of the RRAM cells to be coupled to each other during formation of the first RRAM cell.

11. The method of claim 9, further comprising configuring source lines respectively coupled to a plurality of the RRAM cells to be coupled to each other during formation of the first RRAM cell.

12. The method of claim 9, further comprising configuring a third word line to be coupled to the second word line during formation of the first RRAM cell.

13. The method of claim 9, further comprising forming the first RRAM cell.

14. The method of claim 9, further comprising:
    coupling the first word line to the charge pump circuit; and
    forming the a second RRAM cell coupled to the second word line.

15. A device comprising:
    a first bit line;
    a first variable voltage source configured to selectively provide forming voltages and memory operation voltages to the bit line or a source line, the forming voltages capable of forming RRAM cells, the operational voltages having magnitudes less than the magnitude of the forming voltages and capable of SETTING and RESETTING RRAM cells during memory operations;
    a first resistive random access memory (RRAM) cell coupled between the first bit line and the source line, the first RRAIVI not formed;
    a first word line coupled to the gate of a first transistor of a second RRAIVI cell, the second RRAM cell coupled between the first bit line and the source line; and
    a charge pump circuit coupled to the first word line and configured to provide a negative voltage to the second RRAM cell when the variable voltage source is selectively providing forming voltages to the first RRAIVI cell via the bit line or the source line.

16. The device of claim 15, wherein the variable voltage source selectively provides the forming voltages to the source line.

17. The device of claim 15, wherein the variable voltage source selectively provides the forming voltages to the bit line.

18. The device of claim 15, wherein a maximum voltage magnitude of the memory operation voltages is between 1.2 volts and 2.0 volts, further wherein a maximum voltage magnitude of the forming voltages is between 2.5 volts and 3.5 volts.

19. The device of claim 15, wherein the first RRAM cell comprises hafnium.

20. The device of claim 15, wherein while the first RRAM cell comprises a first variable resistance material selected to have a first resistance of several million ohms when the first RRAM cell remains unformed, further wherein the variable resistance material is further selected to have a second resistance of less than 5000 ohms when the first RRAM cell is formed.

* * * * *